United States Patent [19]
Koffler et al.

[11] 3,955,193
[45] May 4, 1976

[54] METHOD OF DIGITALLY FILTERING SIGNALS WITH SUBSTANTIALLY DIFFERING SIGNAL LEVELS AND APPARATUS THEREFOR

[75] Inventors: Hans Koffler, Rheinbach; Heinz Kraus, Puchheim-Bahnof; Wolfgang Köethmann, Feldafing, all of Germany

[73] Assignee: Siemens Aktiengesellschaft, Berlin & Munich, Germany

[22] Filed: Aug. 1, 1974

[21] Appl. No.: 493,860

[30] Foreign Application Priority Data
Aug. 1, 1973  Germany............................ 2338992

[52] U.S. Cl.............................. 343/5 DP; 235/152
[51] Int. Cl.² ........................................ G01S 7/02
[58] Field of Search ................... 235/152; 343/5 DP

[56] References Cited
UNITED STATES PATENTS

| | | |
|---|---|---|
| 3,370,292 | 2/1968 | Deerfield .......................... 343/5 DP |
| 3,543,021 | 11/1970 | Scarborough.................... 235/152 X |
| 3,553,600 | 1/1971 | Bachnick et al................ 235/152 X |
| 3,797,016 | 3/1974 | Martin ........................... 343/5 DP X |
| 3,852,742 | 12/1974 | Fletcher et al. .............. 343/5 DP X |

*Primary Examiner*—T. H. Tubbesing
*Attorney, Agent, or Firm*—Hill, Gross, Simpson, Van Santen, Steadman, Chiara & Simpson

[57] ABSTRACT

A method of digitally filtering signals with substantially differing signal levels, particularly in the processing of radio and radar signals, in which the level value of the relevant signal, at a predetermined point, is determined and compared with the maximum level value to be processed, a ratio value being formed from said two values, and if necessary, so altering the coefficient of at least one multiplication stage of the filter structure, in dependence upon such ratio, that at least a part of the individual filter units of the filter structure involved is fully loaded, and apparatus for practicing the method.

18 Claims, 3 Drawing Figures

METHOD OF DIGITALLY FILTERING SIGNALS WITH SUBSTANTIALLY DIFFERING SIGNAL LEVELS AND APPARATUS THEREFOR

BACKGROUND OF THE INVENTION

The invention is directed to a method of digital filtering and a digital filter for processing signals with substantially differing signal levels, in particular for use in radio and radar receivers.

For a brief general discussion of digital filters, see "Year Book of Science Technology", McGraw-Hill, Vol. 1971, pages 151–153.

A special property of digital filters is that on account of the quantizing- and error rounding-off, the blocking attenuation is very dependent upon the signal level. If, due to a very low input level, a digital filter is not fully loaded, the registers of the calculating unit will not be fully exploited and as a result of the thus lower relative calculating accuracy (error rounding-off), the blocking attenuation will descend. Also, there is a specific limitation of the dynamic range. The smallest signal to be processed is precisely indicated by the lowest value bit and the highest signal is precisely indicated by the maximum permissable word length.

The objective of the invention is to eliminate these difficulties in the processing of signals over a large dynamic range by means of digital filters, said difficulties being particularly manifest mainly in radio transmission paths and, especially, in radar devices. In accordance with the invention this is achieved in that at least one signal detector is provided which establishes the level of the relevant signal at an appropriate point, and a comparison effected of the actual signal level with the maximum signal level to be processed (i.e. without limiting effect), and from these two values a ratio value is derived which, at least in the case of lower signal levels, is utilized to alter the coefficient of at least one part of the multiplication stages of the filter structure in such manner that at least a part of the individual units thereof is loaded to as full an extent as possible.

As a result, it is possible to at least partially reduce or eliminate the change in the blocking attenuation in dependence upon the signal level which would otherwise be considered as an unfavorable property of digital filters. The invention is of particular importance in all cases in which a large difference in level of the signals to be processed is to be expected from the start. This is in particular the case in radio receivers and, especially in radar receivers in which the signal levels can vary within very wide ranges (large dynamic range).

At the output of the digital filter it is expedient to provide a correction circuit, preferably in the form of an amplifier which is controllable in its amplification, which corrects the signals in accordance with the reciprocal ratio value, so that the correct signal level is obtained. This is of particular significance when the signal processing is to be continued in analogue or level-dependent fashion, for example, in the evaluation of radar echo signals when it is necessary to differentiate, e.g., between large and small targets.

An improvement along the lines of the invention is achieved even if a full loading is obtained at least in the case of part of the units of the digital filter. This is applicable, in particular, to the input stages of the filter, where error roundoff becomes especially manifest in the case of small signal levels.

BRIEF DESCRIPTION OF THE DRAWINGS

In the drawings, wherein like reference characters indicate like or corresponding parts.

DETAILED DESCRIPTION

Figure 1:
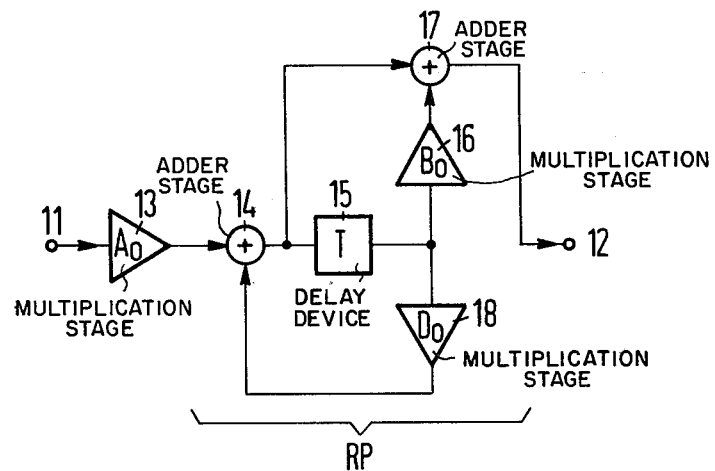
FIG. 1 is a circuit diagram, in block form, of the construction of a conceivable first digital filter module.

Referring to FIG. 1, reference numeral 11 designates the input terminal of the digital filter module. The signals initially pass to a first multiplication stage 13, the coefficient (factor) of which is designated $A_o$. In the simplest circumstances, a controlled amplifier, for example, can be used for this purpose, the amplification factor of which corresponds to the coefficient of the multiplication stage 13, assuming the A/D transformation takes place subsequent to the stage 13. There then follows an adder stage 14, whose output is conducted to a delay device 15 and to a further adder stage 17. The output of the delay device 15 is connected to two multiplication stages 16 (coefficient $B_o$) and 18 (coefficient $D_o$). The multiplication stage 16 is conducted to the second input of the adder stage 17, while the output of the multiplication stage 18 is connected to the second input of the adder stage 14. The output terminal 12 of the illustrated digital filter module is connected to the output of the adder stage 17. The represented first grade digital filter designated by the letters RP forms with its frequency-determining components a real pole in the complex frequency plane. The multiplication stage 13 in no way contributes to the frequency selectivity and therefore is not attributed to RP. In this context a real pole is defined as follows:

$$H(s) = \frac{1}{\frac{s}{wo}+a} \quad wo = \text{cut-off frequency}.$$

With the bilinear z-transformation: $\dfrac{s}{wo} = \dfrac{1}{g} \cdot \dfrac{1-z^{-1}}{1+z^{-1}}$ $g = \tan\dfrac{wo \cdot T}{2}$; $t = \dfrac{1}{fa}$; $fa$=scanning frequency, after multiplying out and collection of terms we have:

$$H(z) = A \cdot \frac{1 + Bz^{-1}}{1 - Dz^{-1}}$$

Further details of calculation are contained in the article "Digital Filters and How to Derive their Block Diagrams" in "Siemens Forschungs- und Entwicklungsberichte", Ed. 1, No. 2/72, pages 227–235.

In the digital filters of known construction type, the multiplication stage 13 is set at a fixed value and in fact usually in such a way that the pass attenuation of the represented digital filter has a specific value preferably 0 dB.

In accordance with the invention, the coefficient $A_o$ of the multiplication stage 13 is influenced and, in particular, in a manner which will be explained in detail with the aid of FIG. 3.

The filter can be so dimensioned that it has high-pass or low-pass characteristics. For this purpose the coefficients $A_o$, $B_o$, $D_o$ will be selected accordingly in known manner.

Figure 2:
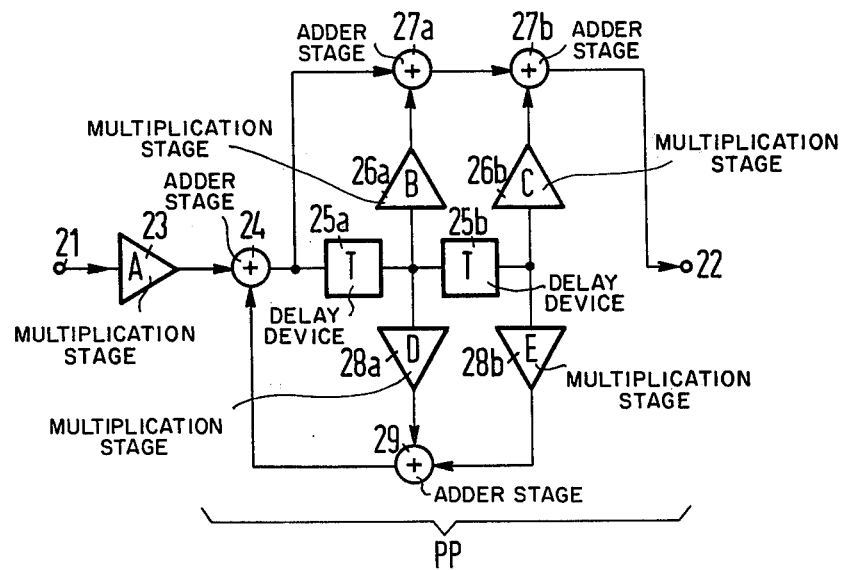
FIG. 2 is a circuit diagram, in block form, of the construction of a conceivable second digital filter module.

A possibility of constructing a module PP with a conjugate complex pair of poles which is suitable to form a digital filter, is shown in FIG. 2. For a conjugate complex pair of poles in the complex frequency plane we have $$H(s) = (a^2 + b^2) \cdot \frac{1}{(s/wo + a^2) + b^2}$$

With the bilinear z-transformation $$\frac{s}{wo} = \frac{1}{g} \cdot \frac{1-z^{-1}}{1+z^{-1}}$$

$$g = \tan woT/2$$

after substitution and collection we have $$H(z) = A \cdot \frac{1 + Bz^{-1} + Cz^{-2}}{1 - Dz^{-1} - Ez^{-2}}$$

The digital filter module represented in this case is a second grade filter. At the input 21 is arranged a multiplication stage 23 which is followed by an adder stage 24, the output of which is connected, on the one hand, to a further adder stage 27a, and, on the other hand, to a delay device 25a operating as pulsed store. At the output of the delay device 25a is aligned a further multiplication stage 26a, whose output is connected to the second input of the adder stage 27a. A second multiplication stage 28a leads to one input of an adder stage 29 whose output is connected to the second input of the adder stage 24. Finally, the signals pass from the output of the delay device 25a to a further delay device 25b which operates as a storage register started by a clock pulse and which at the output end is connected over the multiplication stage 28b to the second input of the adder stage 29 and is also connected over the multiplication stage 26b to an input of a further adder stage 27b whose second input is supplied from the output of the adder stage 27a. The output of the adder stage 27b simultaneously forms the output 22 of the represented digital filter module.

Following the known bilinear z-transformation, the following equation applies to the represented second grade digital filter module:

$$H(z) = \frac{1 + Bz^{-1} + Cz^{-2}}{1 - Dz^{-1} - Ez^{-2}}$$

By appropriately setting the coefficients A to E of the multiplication stages 23, 26a, 26b, 28a, 28b, e.g. in the manner hereinafter explained, the represented digital filter module can also be transformed into a resonator (band pass filter) with corresponding subsidiary pass bands. For this purpose the coefficients — this time commencing from the known standard z-transformation — can be individually selected as follows:

$$A = (1-R) \cdot (1+R)$$

$$B = -\cos(2\pi fr/fa)$$

$$C = 0$$
$$D = 2R\cos(2\pi fr/fa)$$
$$E = -R^2$$
$$fa = 1/T$$
$$b = fa(1-R)/(\pi R)$$

Here $fa$ is the scanning frequency, $fr$ is the resonance frequency in the case of a resonator, and $b$ is the band width given by the 3 dB points. The value $R$ can be calculated by the last equation, commencing from the desired band width. The delay time $T$ of the devices 15, 25a, 25b amounts to $T = 1/fa$. Whereas the usual practice in a digital filter is to set the value of $A$ in the multiplication stage in such manner that the pass attenuation has a specific value preferably 0 dB, in accordance with the invention this multiplication stage obtains differently set coefficients as will be explained in detail with reference to FIG. 3.

Figure 3:
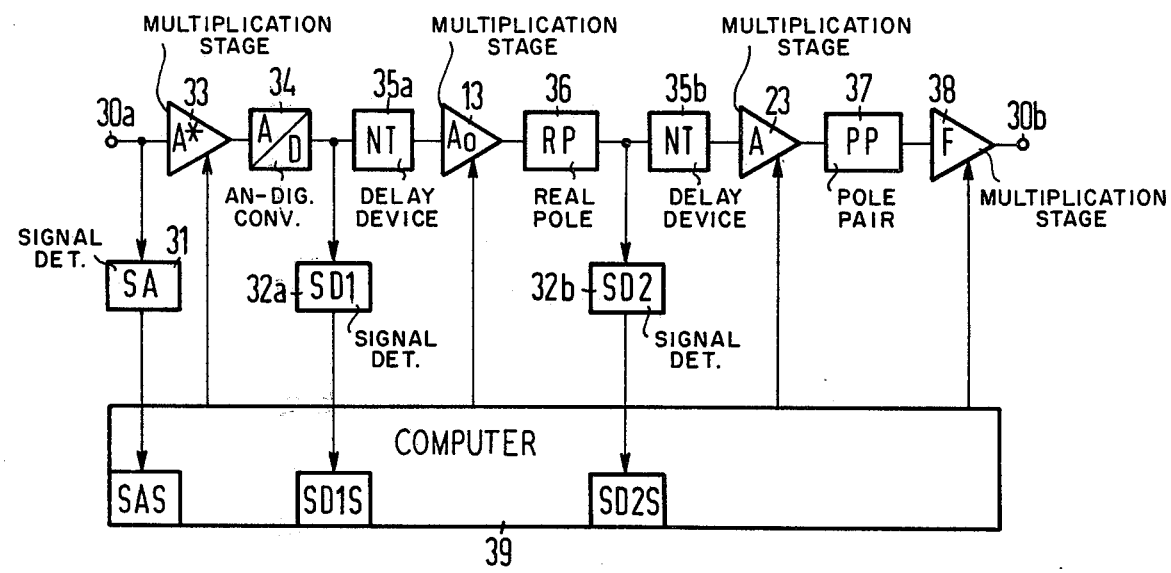
FIG. 3 is a circuit diagram, in block form, of the construction of a digital filter composed of a plurality of digital filter modules, with a control device for changing the coefficients.

FIG. 3 represents a digital filter having an input terminal 30a and an output terminal 30b. Considered from the input, the filter initially contains a first multiplication stage 33 with the coefficient A*, an analogue-digital converter 34, a delay device 35a, a digital filter module of the type represented in FIG. 1 with the elements 13 (multiplication stage with the coefficient $A_o$) and 36 which produces the real pole (RP). There then follows a second delay device 35b, the multiplication stage 23 (coefficient A) and the device 37 which produces a conjugate complex pair of poles (PP) and details of which are illustrated in FIG. 2. A further multiplication stage 38 with the coefficient F is disposed at the output of the digital filter.

At the input of the digital filter there is provided a first signal detector 31 which measures the applied signal level SA in analogue form and transmits it to a computer 39. Prior to the delay device 35a and the delay device 35b, in each case, is disposed a further digital signal detector 32a (SD1) and 32b (SD2). As a result of these individually established signal levels at the input (signal detector 31) and in the intermediate stages (signal detectors 32a and 32b) a control is effected of the coefficients A*, $A_o$, A and F in the multiplication devices 33, 13, 23 and 38. The control commands are derived from a comparison of the actual values (SA, SD1, SD2) with the theoretical (desired) values (SAS, SD1S, SD2S) contained in the computer 39. The theoretical values indicate which levels and word lengths at the relevant points would in fact result in the full loading of the digital filter. The control commands are derived from the ratio value formed, and leads to a change of the coefficients A*, $A_o$, A and F. In this case, the control is carried out in such manner that all or at least a part of the units of the digital filter are loaded to as full an extent as possible. The digital filter must in fact be designed for a specific maximum signal level which it is capable of processing without limiting effect. The same also applies to the analogue-digital converter 34. When a signal arrives which lies precisely at the limiter threshold it is processed by a digital filter with as low as possible a relative error round-off and thus as high as possible a calculating accuracy. On the other hand, in the case of lower signal devices, a complete loading of the individual units is no longer ensured and the relative rounding-off errors increase more and more as the signal level declines. Units which are to be loaded to the fullest extent possible in order to keep the rounding-off errors small, are the multiplication stages.

If the signal detector 31 establishes too low a signal level at the input which would result in an error round-off lying above a tolerance limit, by comparing the actual value (=SA) and the theoretical (desired) value (= value of the limiter threshold — SAS) the computer 39 effects a change in the coefficient A* in the multiplication stage 33. The maximum extent of this change should be such that it will not cause any overloading and thus limitation in the analogue digital converter 34. It is thus ensured that the full dynamic range of the analogue digital converter 34 can be exploited even with respect to a low signal level.

It also may be possible to dispense with the signal detector 32a. It actually is only a check in the digital range over the modulcation of the A/D transformer.

It is established by the signal detector 32b at the output of the digital filter module 36, whether the signal (SD2) contained therein, which has already been partially filtered, is now sufficient to ensure a full loading of the units of the digital filter module 37 (PP) (theoretical value SD2S). If this is not so below a tolerance threshold as a result of a change in the coefficient A, the full loading of the units of the module 37 is ensured. The level at 32b is dependent upon the input level and the signal frequency.

If a correction of the changes is to be achieved through the coefficients A*, $A_o$ and A, the coefficient F is set in such manner that $A^* \cdot A_o \cdot A \cdot F = $ const. (e.g. to a specific value of the pass attenuation, preferably of 0 dB).

The elements 35a and 35b (NT) delay the signal by N scanning periods T. Thus the computer has time to initially consider N scanning values (via 32a and 32b) before it effects a slow change (to avoid interference modulation) with $A_o$ and A. Thus the computer has already seen the N next signals.

In the case of small signals, thus signals which the computer experiences difficulty is analyzing, the coefficients $A_o$ and A expediently will have a normal high value. All in all, an amplification is built into the filter. Weak signals thus are better processed than with a conventional setting of $A_o$ and A. Only when strong signals occur, i.e. signals which can be more easily analyzed by the computer, are $A_o$ and A set back to a value of normal dimensioning.

The analysis of 32a and 32b can include a rectification in order to show the amplitude conditions independently of the signal frequency. The difference between fixed target and moving target will then almost disappear. The changes in the amplitude values generally take place slowly and can be analyzed by a slower computer. The computer can contain a "slow" prediction filter (e.g. similarly to delta modulation in the case of speech signals). In search radar systems, the amplitude change is governed by the width and the rotating speed of the antenna lobe. In search (surveillance) radar, all the "envelopes" caused by time on target are similar. Therefore this form of curve can be permanently incorporated into the computer. In this case it should be noted that in phased array radar systems the signals have a rectangular envelope.

The particular signal detector which is being used can also be arranged at the output of the digital filter. From the previous signal course, the computer 39 is able to predetermine the future signal course. This is particularly so when, for example, in a radar device the target sweep over function (time on target function) is known and the future measured values can be predicted from a few first measured values of such function. It is only necessary to store the known target sweep over function in the computer 39.

In radar devices, the digital filter expediently can be so designed that for use as a moving target filter, a rigid setting may be provided of that part of the coefficient values which do not become effective until a certain suppression of the fixed target signals has been carried out. That is to say that generally fixed targets supply considerably greater input levels than moving targets. When the fixed target filter has been passed through (e.g. 36 in FIG. 3 in which the fixed signals are drastically attenuated) the differences in the signals levels are considerably less than at the input (in FIG. 3 at 30a). Therefore constant coefficients (in FIG. 3 the coefficient A) can be used following the fixed target filter.

A digital filter in accordance with the invention can preferably be used as a Doppler filter (moving target filter) in pulse radar devices, in particular because of the periodicity (line spectrum) of the echo signals which occur.

In radar devices with range quantization, each range channel will be governed by a special set of coefficients (A*, $A_o$, A, F) adapted to the particular situation.

We claim as our invention:

1. A method of digitally filtering signals with substantially differing signal levels, particularly in the processing of radio and radar signals, comprising the steps of determining the level of the relevant signal at a predetermined point, comparing the level value so determined with the maximum level value to be processed, forming from these two values a ratio value, and if necessary, so altering the coefficient of at least one multiplication stage, in dependence upon such ratio, that at least part of the individual digital filter units is fully loaded.

2. A method according to claim 1, comprising correcting the signals, following filtering thereof, in accordance with the reciprocal ratio value so that the original signal level is restored.

3. A method according to claim 1, utilizing a multistage digital filter, wherein the calculating and storage units of the input stages of the digital filter are fully loaded at all signal levels, (, at least with respect to the input stages of the digital filter.)

4. A method according to claim 1, wherein the signal levels are so changed, even prior to analog-digital conversion, that the dynamic range of the converter employed is fully exploited.

5. A method according to claim 1, wherein a change in the coefficients is so effected that all the units of the digital filter are fully loaded.

6. A method according to claim 1, wherein, particularly with respect to time-delayed signal processing, the signal detector is effected at the input of the digital filtering and the change of the coefficients in accordance with the relevant ratio value is not effected until the associated signal level is in fact processed in the relevant unit.

7. A method according to claim 1, wherein the selection of the change speed of the coefficients is sufficiently low that any interference modulation occurring as a result of the change is prevented.

8. A method according to claim 1, wherein the changes in the coefficients are so effected that the product of all the coefficients remains constant.

9. A method according to claim 1, for use in moving target filtering, comprising effecting a predetermined fixed setting for that part of the coefficient values which do not become effective until after a predetermined suppression of the fixed target signals has been carried out.

10. A method according to claim 1 for use in radar devices with range channels, comprising employing a special set of coefficients with each range channel, matched to the particular channel characteristics.

11. A method according to claim 1, for use in radar devices, comprising determining the ratio value from a predicted future signal course determined by a computer from the previous signal course.

12. A method according to claim 11, comprising storing the known target sweep-over function in a computer, from which the future signal course is predetermined.

13. In a digital filter for processing signals with substantially differing signal levels, in particular for use in radio and radar receivers, the combination of a digital filter structure having a plurality of interconnected multiplication stages, at least one signal detector disposed to monitor the relevant signal at a predetermined point, operative to supply a signal value representing said relevant signal, means supplying a signal value correspondingly representing the maximum signal level to be processed, means for effecting a comparison between said signal values and forming a ratio value therefrom, and means for so controlling the coefficient of at least one of said multiplication stages in dependence upon such ratio that at least one part of the filter structure is fully loaded.

14. A digital filter according to claim 13, comprising a correction circuit, disposed at the output of the digital filter, which corrects the signals in accordance with the reciprocal ratio value whereby the correct signal level is restored.

15. A digital filter according to claim 13, particularly in the case of time-delayed signal processing, wherein the signal detector is disposed at the input of the digital filter, and the change of the coefficients in accordance with the relevant ratio value is not effected until the associated signal level is in fact processed in the relevant unit.

16. A digital filter according to claim 13, wherein the signal detector is arranged at the output of the digital filter and from the previous signal course the future signal course is predicted by a computer and the ratio value determined.

17. A digital filter according to claim 13, wherein at the input and/or at the output there are disposed controlled amplifiers which cause an increase or decrease in the signal levels in accordance with the ratio value.

18. A digital filter according to claim 17, wherein said controlled amplifiers operate in the analogue signal range.

* * * * *